(12) United States Patent
Chen et al.

(10) Patent No.: US 9,291,672 B2
(45) Date of Patent: Mar. 22, 2016

(54) DEBUG SYSTEM, APPARATUS AND METHOD THEREOF FOR PROVIDING GRAPHICAL PIN INTERFACE

(71) Applicant: Nuvoton Technology Corporation, Hsinchu Science Park (TW)

(72) Inventors: Xiaohui Chen, Shanghai (CN); Xiaocheng Shen, Shanghai (CN)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 13/842,154

(22) Filed: Mar. 15, 2013

(65) Prior Publication Data

US 2014/0173370 A1  Jun. 19, 2014

(30) Foreign Application Priority Data

Dec. 17, 2012 (CN) ...................... 2012 2 0698610 U

(51) Int. Cl.
*G06F 17/50* (2006.01)
*G01R 31/317* (2006.01)

(52) U.S. Cl.
CPC ................................. *G01R 31/31705* (2013.01)

(58) Field of Classification Search
CPC .............. G06F 11/267; G06F 17/5027; G06F 17/5036; G06F 17/5022; G06F 17/5081; G06F 17/5045; G06F 17/5068; G06F 11/3663; G01R 31/31705; G07F 9/00; H01R 13/665; H01R 31/06

USPC .......................................... 716/100, 106, 136
See application file for complete search history.

(56) References Cited

U.S. PATENT DOCUMENTS

| | | | | |
|---|---|---|---|---|
| 4,811,345 A * | 3/1989 | Johnson | ........................... | 714/27 |
| 5,546,562 A * | 8/1996 | Patel | ............................... | 703/14 |
| 6,988,229 B1 * | 1/2006 | Folea, Jr. | ....................... | 714/727 |
| 7,010,773 B1 * | 3/2006 | Bartz et al. | .................... | 716/121 |
| 7,086,014 B1 * | 8/2006 | Bartz et al. | .................... | 716/102 |
| 7,150,002 B1 * | 12/2006 | Anderson et al. | ............. | 717/107 |
| 7,765,095 B1 * | 7/2010 | Nemecek | ........................ | 703/26 |
| 7,966,345 B1 * | 6/2011 | Funston | ........................ | 707/793 |
| 8,165,866 B2 * | 4/2012 | Cha et al. | ........................ | 703/28 |
| 2001/0042226 A1 * | 11/2001 | Dzoba et al. | .................... | 714/39 |
| 2002/0193980 A1 * | 12/2002 | Higashi et al. | .................. | 703/26 |
| 2003/0078752 A1 * | 4/2003 | Allamsetty | .................... | 702/120 |
| 2003/0217343 A1 * | 11/2003 | Rajsuman et al. | ................ | 716/4 |
| 2004/0153890 A1 * | 8/2004 | Davis et al. | .................... | 714/699 |
| 2006/0242499 A1 * | 10/2006 | Volz | ............................... | 714/724 |
| 2006/0248390 A1 * | 11/2006 | Hori et al. | ........................ | 714/28 |
| 2009/0182535 A1 * | 7/2009 | Ananny et al. | ................ | 702/186 |
| 2010/0235698 A1 * | 9/2010 | Diewald et al. | .............. | 714/731 |
| 2014/0207402 A1 * | 7/2014 | Ferry | ............................. | 702/119 |

* cited by examiner

*Primary Examiner* — Suchin Parihar
(74) *Attorney, Agent, or Firm* — Muncy, Geissler, Olds & Lowe, P.C.

(57) ABSTRACT

A debug apparatus for debugging a chip under test with a plurality of pins is provided. The debug apparatus includes a processor for controlling the chip under test via a bridge device. The processor provides graphical data to indicate pin states of the chip under test when the chip under test is controlled by the processor.

26 Claims, 5 Drawing Sheets

DEBUG SYSTEM, APPARATUS AND METHOD THEREOF FOR PROVIDING GRAPHICAL PIN INTERFACE

CROSS REFERENCE TO RELATED APPLICATIONS

This Application claims priority of China Patent Application No. 201220698610, filed on Dec. 17, 2012, the entirety of which is incorporated by reference herein.

BACKGROUND OF THE INVENTION

1. Field of the Invention

The invention relates to a debug system, and more particularly, to a debug system for providing a graphical pin interface.

2. Description of the Related Art

Microcontrollers (MCUs) or microprocessors have been widely applied to many industrial and household products. At present, when developing a program for a microcontroller/microprocessor, a chip emulation system is required, wherein the program is executed until several preset breakpoints reach and stop at the preset breakpoints to monitor the status of the program, for tracing and debugging the program.

BRIEF SUMMARY OF THE INVENTION

Debug apparatuses, systems and methods thereof for providing a graphical pin interface are provided. An embodiment of a debug apparatus for debugging a chip under test with a plurality of pins is provided. The debug apparatus comprises a processor for controlling the chip under test via a bridge device. The processor provides graphical data to indicate pin states of the chip under test when the chip under test is controlled by the processor.

Furthermore, an embodiment of a debug system is provided. The debug system comprises: a chip under test comprising a plurality of pins; a bridge device coupled to the chip under test; and a debug apparatus coupled to the bridge device. The debug apparatus comprises: a processor for controlling the chip under test via the bridge device; and a display unit for displaying a graphical pin interface. The graphical pin interface indicates pin states of the chip under test when the chip under test is controlled by the processor.

Moreover, an embodiment of a debugging method for a debug apparatus is provided, wherein the debug apparatus is coupled to a chip under test comprising a plurality pins via a bridge device. Graphical data is generated. The graphical data indicates pin states of the chip under test when the chip under test is controlled by the debug apparatus.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

For debugging a microcontroller/microprocessor, an in-circuit emulator (ICE) is used. The microcontroller/microprocessor under test can be implemented in an integrated circuit (IC) of a printed circuit board, and the ICE is coupled between the PCB and a debug apparatus. The debug apparatus may be a computer or an electronic device, such as a personal computer, a tablet computer or a mobile phone, and the debug apparatus is provided with an integrated development environment (IDE). Therefore, an engineer can simulate the actions of the microcontroller/microprocessor via the IDE, so as to shorten the development time and debugging time for a program.

Figure 1:
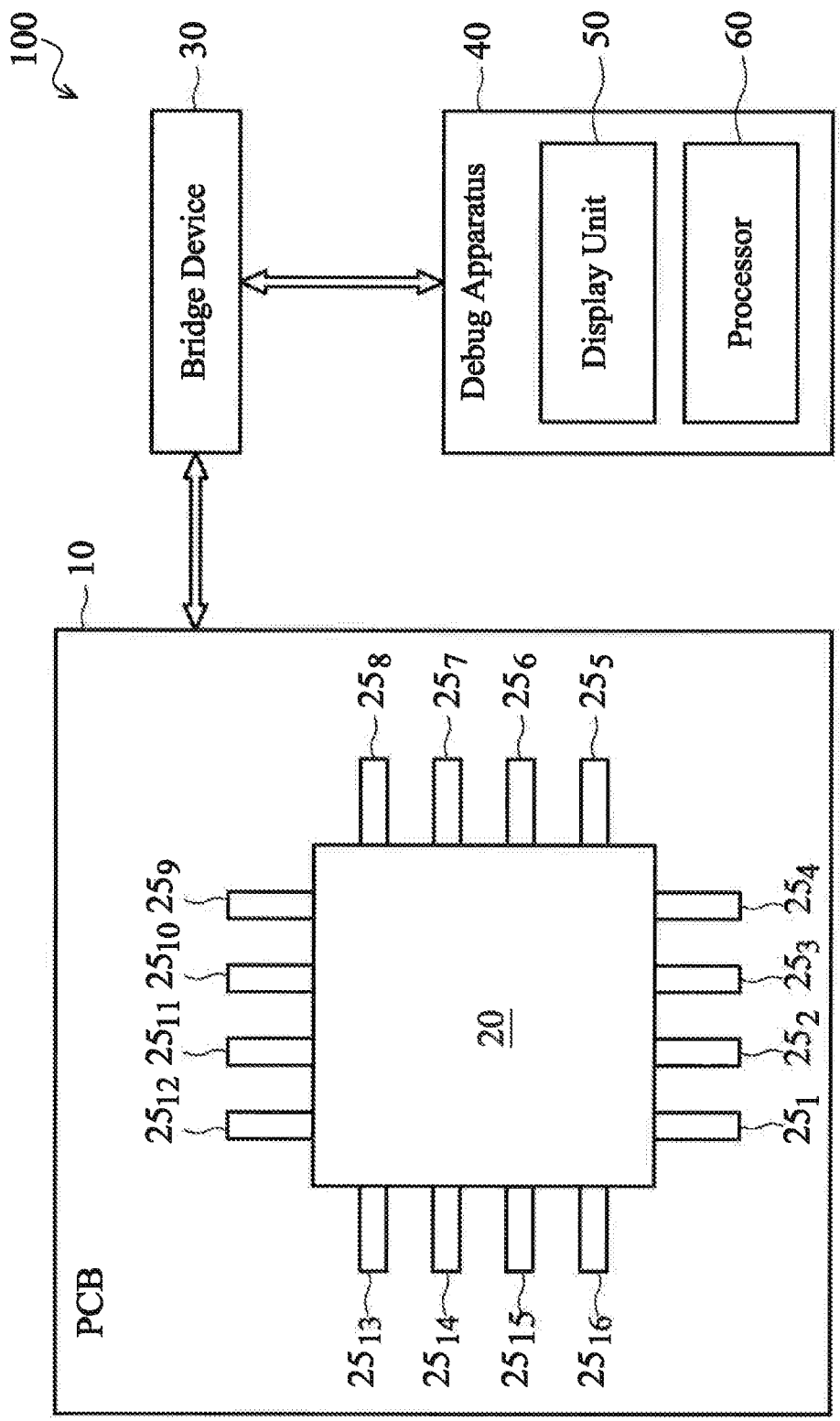
FIG. 1 shows a debug system according to an embodiment of the invention.

FIG. 1 shows a debug system 100 according to an embodiment of the invention. The debug system 100 includes a printed circuit board (PCB) 10, a bridge device 30, and a debug apparatus 40, wherein a chip under test 20 disposed on the PCB 10 has a plurality of pins $25_1$-$25_{16}$. In the embodiment, the amount of the pins $25_1$-$25_{16}$ is an example and not to limit the invention. The debug apparatus 40 includes a display unit 50 and a processor 60. In the embodiment, the debug apparatus 40 may be a personal computer with an integrated development environment (IDE). The bridge device 30 is an emulator used in the IDE, such as a ULink, J-Link or Nu-Link emulator. In the embodiment, the processor 60 of the debug apparatus 40 can access the registers and the memories of the chip under test 20 via the bridge device 30 by the IDE, so as to control the microcontroller/microprocessor of the chip under test 20 to perform various programs and generate graphical data. Simultaneously, in the IDE, the processor 60 can use a graphical pin interface to display the graphical data. Thus, users will be able to edit and diagnose the pin state of the chip under test 20 via the graphical pin interface. In one embodiment, the debug apparatus 40 can generate the graphical data via a graphical data generating device (e.g. a controller, a logic processing unit). In one embodiment, the processor 60 can transmit the graphical data to an external display unit (e.g. a display) via various transmission interfaces for displaying the graphical data.

Figure 2:
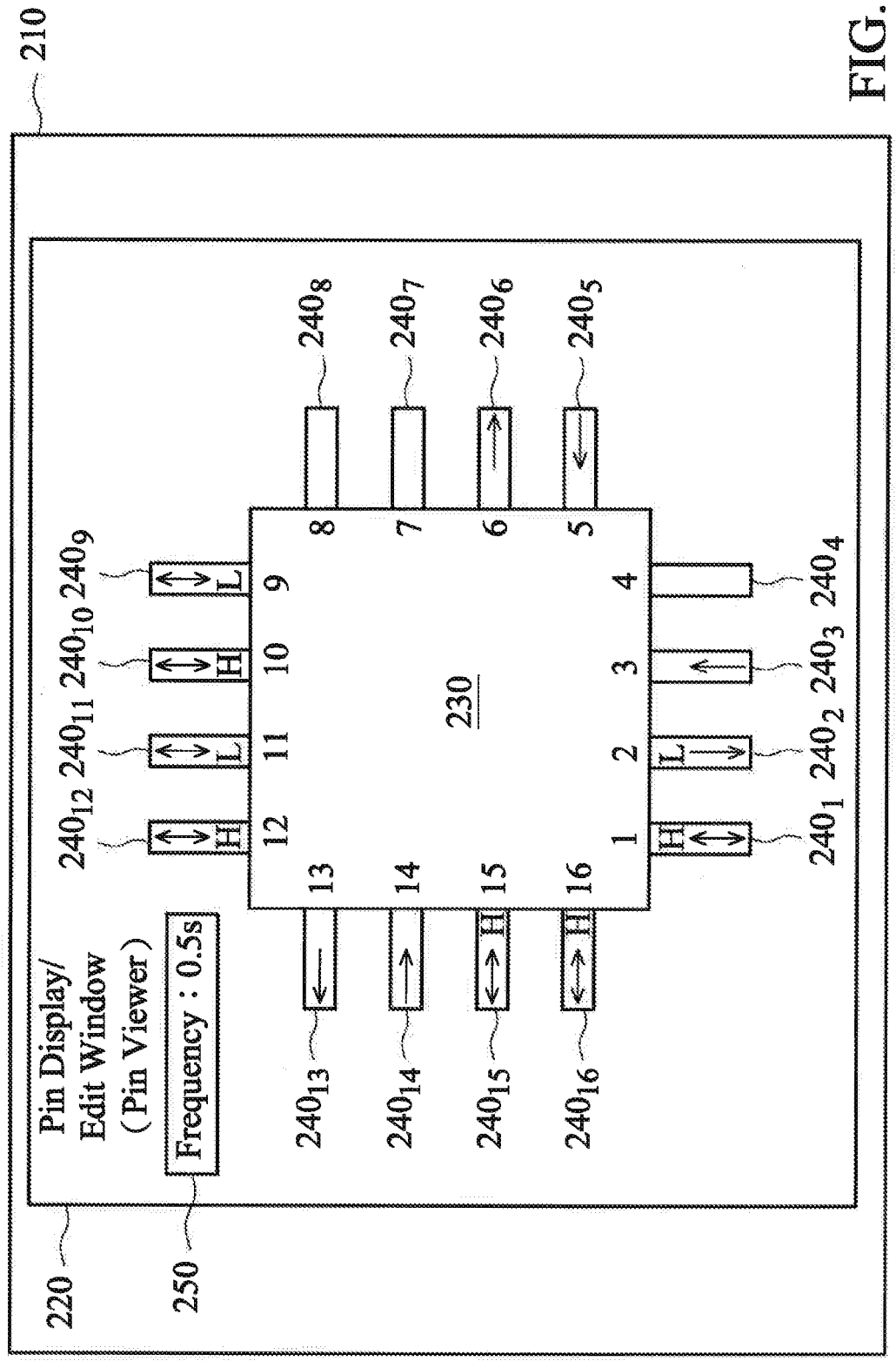
FIG. 2 shows a graphical user interface (GUI) comprising graphical data according to an embodiment of the invention, wherein the GUI is displayed in the display unit of FIG. 1 or an external display unit.

FIG. 2 shows a graphical user interface (GUI) including graphical data according to an embodiment of the invention, wherein the GUI can be displayed in the display unit 50 of FIG. 1 or an external display unit (e.g. a display). In FIG. 2, a label 210 represents a GUI of an IDE, and a label 220 represents a graphical pin interface (e.g. a pin viewer) according to an embodiment of the invention. Referring to FIG. 1 and FIG. 2 together, the state of the pins $25_1$-$25_{16}$ are dynamically displayed on the graphical pin interface 220 when the chip under test 20 is controlled by the processor 60 of the debug apparatus 40 via the bridge device 30. The graphical pin interface 220 includes a chip object 230 and a plurality of pin objects $240_1$-$240_{16}$. The chip object 230 has an exterior corresponding to the chip under test 20, and each pin object corresponds to the individual pin of the chip under test 20. For example, the pin object $240_1$ corresponds to the pin $25_1$ of the chip under test 20, and the pin object $240_2$ corresponds to the pin $25_2$ of the chip under test 20, and so on. Therefore, the amount of the pin objects $240_1$-$240_{16}$ is identical to that of the pins $25_1$-$25_{16}$. According to the embodiment, the processor 60 periodically uses breakpoints to monitor the executing state of a program for the chip under test 20, wherein a user can set a frequency of the breakpoints according to actual applications, as shown by label 250. Furthermore, in response to each breakpoint, the processor 60 displays the states of the pins $25_1$-$25_{16}$ on the corresponding pin objects $240_1$-$240_{16}$ of the graphical pin interface 220. For example, the pin object $240_1$ can use an indication symbol (e.g. a double arrow symbol) to represent that a signal direction of the pin $25_1$ is bidirectional (input/output), and the pin object $240_1$ can also use an indication symbol, such as "H", to represent that a signal of the pin $25_1$ is at a high logic level. Furthermore, the pin object $240_2$ can use an indication symbol (e.g. a single arrow symbol) to represent that a signal direction of the pin $25_2$ is output, and the pin object $240_2$ can also use an indication symbol, such as "L", to represent that a signal of the pin $25_2$ is at a low logic level.

Figure 3:
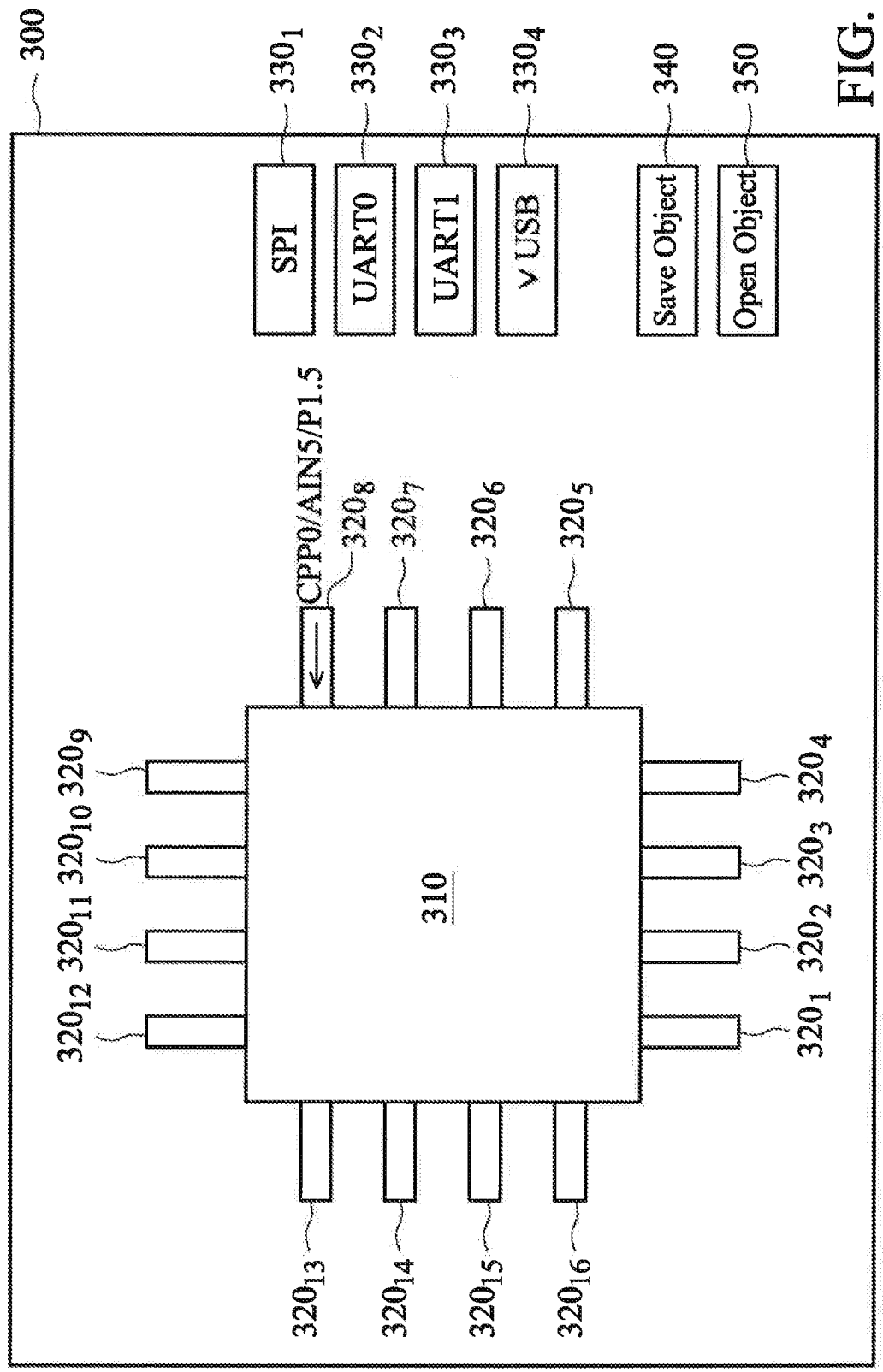
FIG. 3 shows a graphical pin interface comprising graphical data according to an embodiment of the invention, wherein the graphical pin interface is displayed in the display unit of FIG. 1 or an external display unit.

FIG. 3 shows a graphical pin interface 300 including graphical data according to an embodiment of the invention, wherein the graphical pin interface 300 can be displayed in the display unit 50 of FIG. 1 or an external display unit (e.g. a display). The graphical pin interface 300 includes a chip object 310, a plurality of pin objects $320_1$-$320_{16}$, a plurality of function module objects $330_1$-$330_4$, a save object 340 and an open object 350. In FIG. 3, each of the function module objects $330_1$-$330_4$ can correspond to a specific function via an indication signal (e.g. a specific color). In the embodiment, the function module object $330_1$ can have a first color and correspond to a serial peripheral interface (SPI) function. The function module object $330_2$ can have a second color and correspond to a first universal asynchronous receiver transmitter (UART) function. The function module object $330_3$ can have a third color and correspond to a second UART function. The function module object $330_4$ can have a fourth color and correspond to a universal serial bus (USB) function. Therefore, by clicking the pin objects $320_1$-$320_{16}$, the user can set the pin objects $320_1$-$320_{16}$ to the corresponding function modules. For example, when the pin object $320_8$ is set to the function module object $330_1$, the pin object $320_8$ can have a color identical with the function module object $330_1$ (i.e. the first color). In other words, the pin $25_8$ of the chip under test 20 corresponds to the SPI function. Furthermore, the pin types of the pin $25_1$-$25_{16}$ of the chip under test 20 of FIG. 1 can be set via the pin objects $320_1$-$320_{16}$, and then the pin types of the pin $25_1$-$25_{16}$ can be displayed around the corresponding pin objects $320_1$-$320_{16}$. For example, via the pin object $320_8$, the pin type of the pin $25_8$ of the chip under test 20 is set to a comparator pin CPP0, an analog pin AIN5 or a general purpose input/output (GPIO) pin P1.5. Moreover, the user can also change the input/output states (e.g. input, output or bidirectional) of the pins $25_1$-$25_{16}$ of the chip under test 20 via the pin objects $320_1$-$320_{16}$, as shown in the arrow of the pin object $320_8$. In the embodiment, if no pin has been set to a function module, the function module object corresponding to the function module can use an indication signal (e.g. a specific color) to represent that the pin has not been set to a function module. In addition, if all pins have been set for a function module, the function module object corresponding to the function module is marked, as shown in the function module object $330_4$ (e.g. v). Specifically, the user can set the pin $25_1$-$25_{16}$ of the chip under test 20 of FIG. 1 via the graphical pin interface 300. After the setting is completed; a user can click the save object 340 to store the settings of the pin objects $320_1$-$320_{16}$ to the processor 60 or a storage device (not shown) of the debug apparatus. Moreover, the user can also click the open object 350 to load the settings of the pin objects $320_1$-$320_{16}$ stored in the storage device, so as to write the settings to the chip under test 20 via the IDE.

Figure 4:
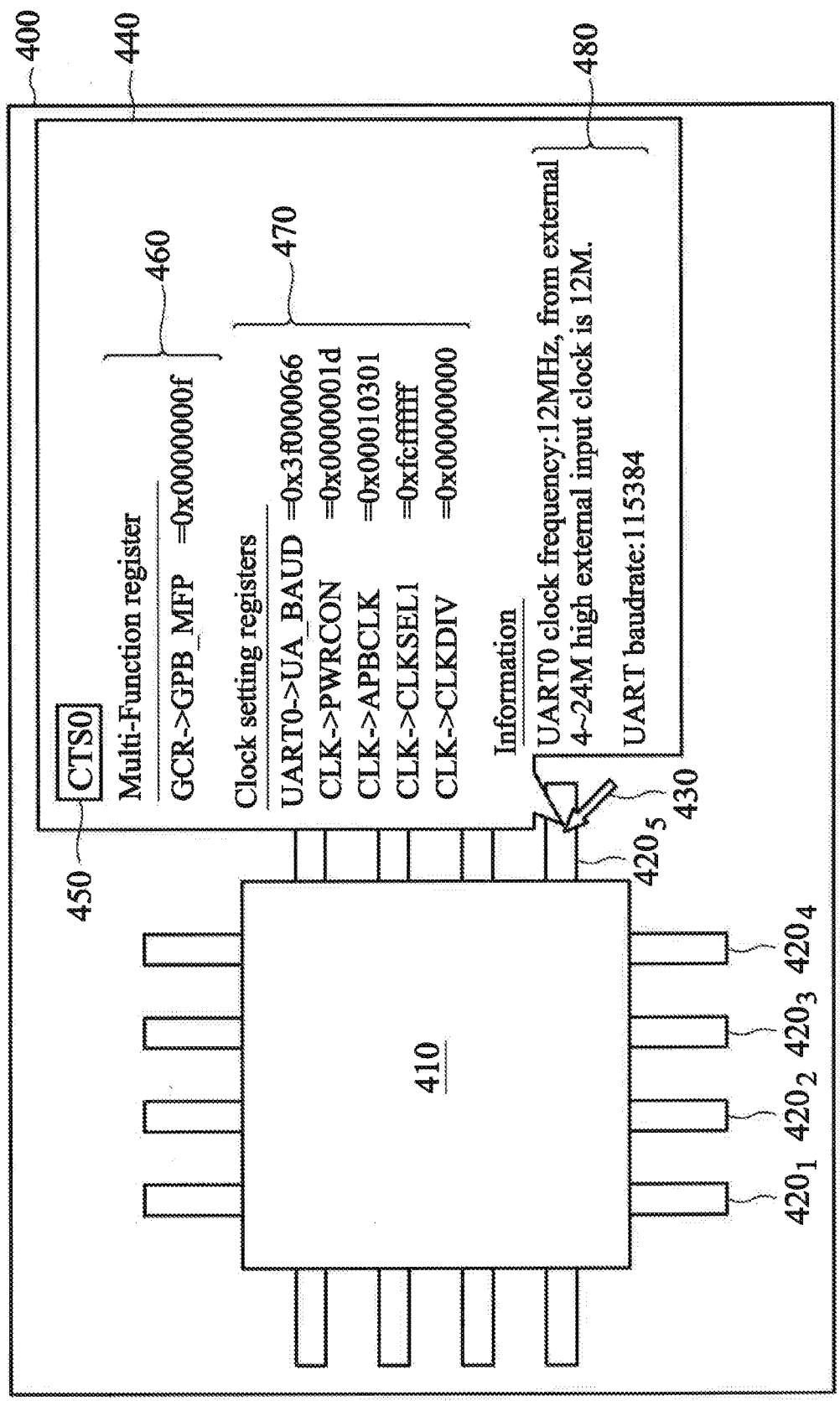
FIG. 4 shows a graphical pin interface comprising graphical data according to another embodiment of the invention, wherein the graphical pin interface is displayed in the display unit of FIG. 1 or an external display unit.

FIG. 4 shows a graphical pin interface 400 including graphical data according to another embodiment of the invention, wherein the graphical pin interface 400 can be displayed in the display unit 50 of FIG. 1 or an external display unit (e.g. a display). Referring to FIG. 1 and FIG. 4 together, when a user moves a cursor 430 on a pin object $420_5$ of a chip object 410, a message window 440 of the pin object $420_5$ can be displayed in the display unit 50 or the external display unit, wherein the message window 440 can be provided by the processor 60, and the message window 440 records the pin information of the pin $25_5$ of the chip under test 20. The pin information includes the pin name, settings of the related registers and frequency or source of the corresponding clocks, and so on. In FIG. 4, a label 450 may represent a pin name of the pin $25_5$. If the pin $25_5$ is a multi-function pin, a label 460 may represent a setting of a function module register thereof. A label 470 may represent the settings of clock registers of the pin $25_5$. A label 480 may represent the information with regard to the pin $25_5$ functioning as a UART equipment, such as a clock frequency/source, baud rate and so on. Furthermore, compared to only using the IDE to debug the chip under test 20, the processor 60 of FIG. 1 may further display an abnormal message in the message window 440. For example, if a signal of a pin can not be toggled when the pin is set as a GPIO pin, the message window 440 may display that a leakage has occurred at the pin. Moreover, if a setting of the related register of a pin is undefined (i.e. invalid), the processor 60 can use a specific color to mark the setting of the register of the message window 440 for user confirmation. For example, the clock source is invalid or the baud rate is not located in an allowable range when the pin functions as the UART equipment.

Figure 5:
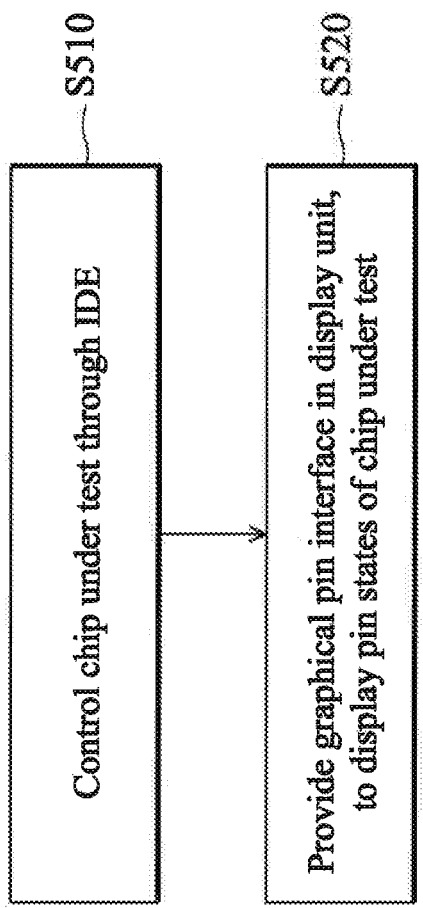
FIG. 5 shows a debugging method for a debug apparatus according to an embodiment of the invention.

FIG. 5 shows a debugging method for a debug apparatus according to an embodiment of the invention. In the embodiment, the debug apparatus (e.g. 40 of FIG. 1) is coupled to a chip under test (e.g. 20 of FIG. 1) via a bridge device (e.g. 30 of FIG. 1). The chip under test includes a plurality of pins. The debug apparatus includes a processor and a display unit. First, in step S510, the processor controls the chip under test via an IDE. For example, the registers of the chip under test are set by the IDE. Next in step S520, the processor of the debug apparatus provides graphical data to a graphical pin interface of the display unit (implemented in the debug apparatus or an external display unit coupled to the debug apparatus) for dynamically displaying pin states of the chip under test. As described above, the graphical pin interface includes a chip object corresponding to an exterior of the chip under test and a plurality of pin objects corresponding to the pins of the chip under test. Thus, the user can set the pins of the chip under test via the pin objects, wherein the related information of the corresponding pins is displayed trough the pin objects.

An IDE can control microcontroller/microprocessor to perform instructions according to a sequence of a program, or check the execution result by using the breakpoints in the instructions, to debug a chip. According to the embodiments, a user can periodically monitor the execution result with the breakpoints according to actual applications via a graphical pin interface. Furthermore, the execution result of the instructions dynamically displays pin states of the chip via the graphical pin interface. In addition, according to actual applications, the user can modify the settings of the pins via the graphical pin interface immediately. Therefore, complexity of debugging a chip is decreased for the user, and the development time e and debugging time for a program is shortened.

The methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application specific logic circuits. For example, when the debug apparatus is a personal computer, the processor may be a central processing unit (CPU) of the computer, and the CPU may perform the program to implement the partial/entire embodiments. If the debug apparatus is a tablet computer or a mobile phone, the processor may be the original processor of the tablet computer/mobile phone.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A debug apparatus for debugging a chip under test with a plurality of pins, wherein a program is stored in the chip under test, and the debug apparatus comprising:
a processor, controlling the chip under test via an emulator, and obtaining electric signals from at least one of the plurality of pins of the chip under test via the emulator when the chip under test is controlled by the processor to perform the program,
wherein the processor is configured to provide graphical data, which includes a chip object representing a first image corresponding to an exterior of the chip under test, and a plurality of pin objects, wherein each of the pin objects represents a second image corresponding to the individual pin of the chip under test, to indicate pin states of the chip under test according to the electric signals,
wherein the first image and the second images are displayed in a display unit via a graphical pin interface,
wherein relative positions of the first image and the second images are identical to relative positions of the chip under test and the pins of the chip under test.

2. The debug apparatus as claimed in claim 1, wherein the pin object has a first indication symbol for displaying a function module of the pin corresponding to the pin object.

3. The debug apparatus as claimed in claim 1, wherein the pin object has a second indication symbol for displaying a signal direction of the pin corresponding to the pin object.

4. The debug apparatus as claimed in claim 1, wherein the pin object has a specific color for displaying a function module of the pin corresponding to the pin object, or has an arrow symbol for displaying a signal direction of the pin corresponding to the pin object.

5. The debug apparatus as claimed in claim 1, wherein when a cursor of the display unit is moved on the pin object, the display unit displays a message window corresponding to the pin object.

6. The debug apparatus as claimed in claim 5, wherein the message window comprises pin information of the chip under test, wherein the pin information comprises function information, settings of registers, input/output states of signals, or frequencies or sources of clocks of the pin corresponding to the pin object.

7. The debug apparatus as claimed in claim 6, wherein the display unit displays an abnormal message in the message window when the pin information is incorrect.

8. The debug apparatus as claimed in claim 1, wherein an input/output state or a function module of the pin of the chip under test is set via the pin object.

9. The debug apparatus as claimed in claim 1, wherein when the chip under test is controlled by the processor, the pin states of the chip under test are dynamically displayed in the second images via the graphical pin interface for editing and diagnosis, wherein the first image is a first icon, and the second image is a second icon smaller than the first icon.

10. The debug apparatus as claimed in claim 1, wherein the processor accesses a register and a memory of the chip under test to control performing of the program.

11. The debug apparatus as claimed in claim 1, wherein the processor uses a plurality of breakpoints to monitor executing state of the program for the chip under test, and in response to each of the breakpoints, the processor displays state of the one of the plurality of pins on the corresponding pin objects of the graphical pin interface.

12. The debug apparatus as claimed in claim 1, wherein at least one of electric signals from the one of the plurality of pins indicates execution result of the program.

13. The debug apparatus as claimed in claim 1, wherein the chip under test comprises a microprocessor, wherein the program is executed by the microprocessor, and the emulator is an in-circuit emulator (ICE).

14. A debug system, comprising:
a chip under test, comprising a plurality of pins, wherein a program is stored in the chip under test;
an emulator coupled to the chip under test; and
a debug apparatus coupled to the emulator, comprising:
a processor, controlling the chip under test via the emulator, and obtaining electric signals from at least one of the plurality of pins of the chip under test via the emulator when the chip under test is controlled by the processor to perform the program; and
a display unit for displaying a chip object representing a first image corresponding to an exterior of the chip under test, and a plurality of pin objects, wherein each of the pin objects represents a second image corresponding to the individual pin of the chip under test and indicating pin states of the chip under test according to the electric signals when the chip under test is controlled by the processor via a graphical pin interface,
wherein relative positions of the first image and the second images are identical to relative positions of the chip under test and the pins of the chip under test.

15. The debug system as claimed in claim 14, wherein when the chip under test is controlled by the processor, the pin states of the chip under test are dynamically displayed in the second images via the graphical pin interface for editing and diagnosis, wherein the first image is a first icon, and the second image is a second icon smaller than the first icon.

16. A method for debugging a chip under test comprising a plurality pins via an emulator, wherein a program is stored in the chip under test, and the method comprising:
    obtaining electric signals from at least one of the plurality of pins of the chip under test via the emulator when the chip under test is controlled to perform the program; and
    generating graphical data according to the electric signals, wherein the graphical data indicates states of the pins of the chip under test,
    wherein the graphical data comprises a chip object representing a first image corresponding to an exterior of the chip under test, and a plurality of pin objects, wherein each of the pin object represents a second image corresponding to the individual pin of the chip under test; and
    displaying the first image and the second images in a display unit via a graphical pin interface,
    wherein relative positions of the first image and the second images are identical to relative positions of the chip under test and the pins of the chip under test.

17. The method as claimed in claim 16, further comprising:
    displaying a message window of the pin corresponding to the pin object on the display unit when a cursor of the display unit is moved on the pin object.

18. The method as claimed in claim 16, wherein the message window comprises pin information of the chip under test, wherein the pin information comprises function information, settings of registers, input/output states of signals, or frequencies or sources of clocks of the pin corresponding to the pin object.

19. The method as claimed in claim 18, further comprising:
    displaying an abnormal message in the message window when the pin information is incorrect.

20. The method as claimed in claim 16, further comprising:
    setting an input/output state or a function module of the pin of the chip under test via the pin object.

21. The method as claimed in claim 16, wherein the debugging apparatus controls a microcontroller/microprocessor of the chip under test through integrated development environment to further perform a program to generate the graphical data.

22. The method as claimed in claim 16, further comprising:
    dynamically displaying the pin states of the chip under test in the second images via the graphical pin interface for editing and diagnosis,
    wherein the first image is a first icon, and the second image is a second icon smaller than the first icon.

23. The method as claimed in claim 16, wherein the processor accesses a register and a memory of the chip under test to control performing of the program.

24. The method as claimed in claim 16, further comprising:
    using a plurality of breakpoints to monitor executing state of the program for the chip under test; and
    in response to each of the breakpoints, displaying state of the one of the plurality of pins on the corresponding pin objects of the graphical pin interface.

25. The method as claimed in claim 16, wherein at least one of electric signals from the one of the plurality of pins indicates execution result of the program.

26. The method as claimed in claim 16, wherein the chip under test comprises a microprocessor, wherein the program is executed by the microprocessor, and the emulator is an in-circuit emulator (ICE).

* * * * *